(12) United States Patent
Doller et al.

(10) Patent No.: US 12,362,016 B2
(45) Date of Patent: Jul. 15, 2025

(54) READ LATENCY REDUCTION FOR PARTIALLY-PROGRAMMED BLOCK OF NON-VOLATILE MEMORY

(71) Applicant: Intel NDTM US LLC, Santa Clara, CA (US)

(72) Inventors: Joseph F. Doller, El Dorado Hills, CA (US); Kristopher H. Gaewsky, El Dorado Hills, CA (US); Noah Mebane, Sacramento, CA (US)

(73) Assignee: Intel NDTM US LLC, Santa Clara, CA (US)

( * ) Notice: Subject to any disclaimer, the term of this patent is extended or adjusted under 35 U.S.C. 154(b) by 982 days.

(21) Appl. No.: 17/112,401

(22) Filed: Dec. 4, 2020

(65) Prior Publication Data
US 2021/0118510 A1    Apr. 22, 2021

(51) Int. Cl.
| | | |
|---|---|---|
| G11C 16/08 | (2006.01) | |
| G11C 16/04 | (2006.01) | |
| G11C 16/12 | (2006.01) | |

(52) U.S. Cl.
CPC .......... *G11C 16/08* (2013.01); *G11C 16/0458* (2013.01); *G11C 16/12* (2013.01)

(58) Field of Classification Search
CPC ..... G11C 16/08; G11C 16/0458; G11C 16/12; G11C 16/0483; G11C 16/26
See application file for complete search history.

(56) References Cited

U.S. PATENT DOCUMENTS

| | | |
|---|---|---|
| 9,208,888 B1 | 12/2015 | Wakchaure et al. |
| 9,659,664 B1 * | 5/2017 | Griffin ................ G11C 11/5628 |
| 2015/0092488 A1 | 4/2015 | Wakchaure et al. |
| 2016/0147582 A1 * | 5/2016 | Karakulak ............ G06F 11/079 714/37 |
| 2019/0042356 A1 | 2/2019 | Chen et al. |

* cited by examiner

*Primary Examiner* — Donald H B Braswell
(74) *Attorney, Agent, or Firm* — Morgan, Lewis & Bockius LLP

(57) ABSTRACT

Proactively adjusting read voltages at the system level, before performing a read operation on data located in a partially-programmed block in a block-addressable non-volatile memory, can significantly reduce the re-read trigger rate. This reduces the rate of entering a read recovery flow and subsequent read latency. Determining in advance a wordline-specific pattern of wordline offsets associated with past unsuccessful reads in partially-programmed blocks allows read voltages to be proactively adjusted for vulnerable wordlines. Read voltages are restored for subsequent read operations.

21 Claims, 8 Drawing Sheets

Wordline-specific pattern of unsuccessful reads and corresponding wordline offsets,
e.g., [0, 1, 2, 3]
602

| Wordline Offset | # Reads | # Reads w/ECC Errors | ECC Error Rate |
|---|---|---|---|
| 0 | 204289 | 6 | $2.93702 \times 10^{-05}$ |
| 1 | 443116 | 19 | $4.28782 \times 10^{-05}$ |
| 2 | 763498 | 93 | $1.21808 \times 10^{-04}$ |
| 3 | 1132130 | 43 | $3.79815 \times 10^{-05}$ |
| 4 | 1145057 | 0 | 0 |
| 5 | 1120415 | 0 | 0 |
| Sum | | 161 | |

FIG. 6

READ LATENCY REDUCTION FOR PARTIALLY-PROGRAMMED BLOCK OF NON-VOLATILE MEMORY

TECHNICAL FIELD

Various examples are described herein that relate to control of signal levels applied to a memory device in order to access data.

BACKGROUND

Memory and storage devices are commonly used in computing systems, such as client or cloud computing environments. For example, smart phones, tablet computers, and laptops commonly use memory and storage devices for data storage and retrieval. Servers and data centers in cloud computing or edge computing also use memory and storage devices for data storage and retrieval.

Memory and storage devices are physical objects whose properties change over time or vary from device to device. Care is taken to provide operating conditions such as voltage or current levels that allow the devices to perform data storage and retrieval in a manner that seeks to improve the accuracy of retrieved data relative to what data what was stored or reduces the time incurred to retrieve accurate data.

BRIEF DESCRIPTION OF THE DRAWINGS

Features of embodiments of the claimed subject matter will become apparent as the following detailed description proceeds, and upon reference to the drawings, in which like numerals depict like parts, and in which:

FIG. 6 illustrates an example of a wordline-specific pattern of wordline offsets and re-read trigger rates that can be used to implement an embodiment of read latency reduction for partially-programmed blocks in the example system, devices and processes illustrated in FIGS. 1-3, 4A-4B and 5A-5B.

DETAILED DESCRIPTION

Figure 1:
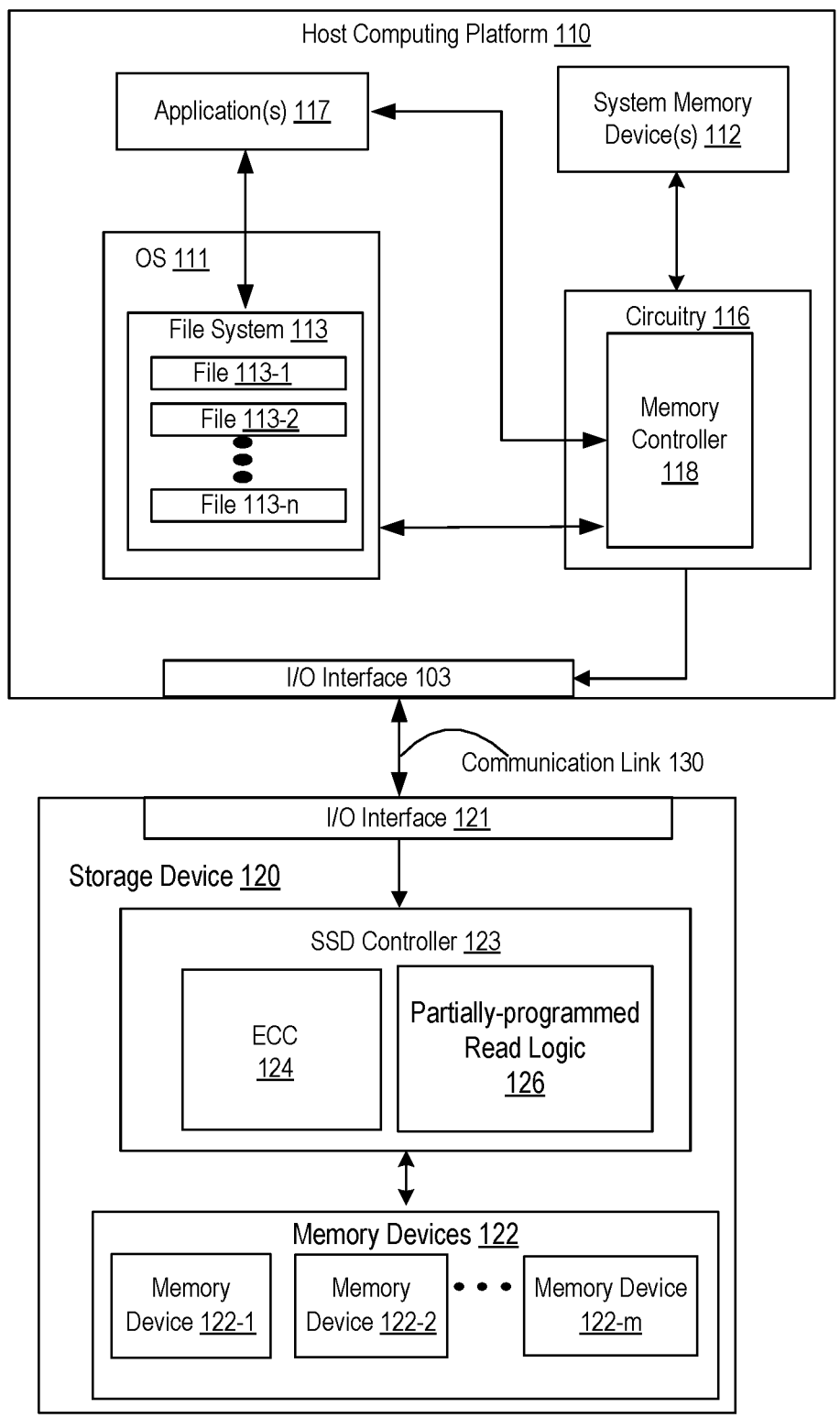
FIG. 1 illustrates a block diagram of an example computer system that includes non-volatile memory in which an embodiment of read latency reduction for partially-programmed blocks can be implemented.

In part due to changes in operating characteristics of a memory device, the voltage applied to successfully read any region of the memory device can change over time. Together with use of error correction code (ECC) to recover data, read and re-read operations applied to memory may be needed to successfully read data.

To try to recover the correct data the system issues a series of commands and re-reads, referred to as a read recovery flow. For example, for a given read failure, the voltage is typically adjusted and re-read, which may or may not lead to additional ECC failures and further voltage adjustment. Triggering these special re-reads has a high probability of returning correctable data but comes with an increased read latency. In some cases, reading non-volatile memory can result in ECC uncorrectable data being returned.

Various embodiments described herein attempt to reduce a number of re-read operations, also referred to as the re-read trigger rate of entering the read recovery flow. In particular, various embodiments provide for proactively adjusting read voltages applied to one or more portions of partially-programmed blocks of the memory device, also referred to as open blocks. Proactively adjusting the read voltage to compensate for certain characteristics of partially-programmed blocks can reduce a number of read and re-read operations which, in turn, reduces read latency.

For example, in one embodiment, a partially-programmed read logic can reduce the rate of entering the read recovery flow, i.e., the re-read trigger rate, on partially-programmed blocks from ~3E-6 to ~1E-9, a significant reduction. A reduction in re-read trigger rate directly reduces the read latency and improves the performance of a memory device, including lengthening its useful life. The reduction in re-read trigger rate can be especially effective on storage devices such as solid state drives (SSDs) with multiple streams, as these devices typically experience a higher percentage of partially-programmed blocks in the block addressable non-volatile memory devices in the SSD.

Prior approaches to reducing read latency wait for a failure to occur and reactively trigger re-reads. In contrast, various embodiments described herein proactively adjust the read voltage prior to reading a partially-programmed block in the block addressable non-volatile memory devices in the SSD to significantly reduce the chance of triggering a re-read.

Based on analysis of data acquired through a media qualification test of an example SSD that can reveal the re-read trigger rate, it can be determined that reads on partially-programmed blocks in the block addressable non-volatile memory devices in the SSD are the source of a significant number of re-read triggers. Logging the state of a block (fully or partially-programmed) at the time of a re-read trigger confirms that the vast majority of the re-read triggers are caused by reads on partially-programmed blocks, as summarized in Table 1.

TABLE 1

| Partially-programmed vs Fully-programmed block read trigger rate | |
|---|---|
| RUNTIME | 20 HOURS |
| #Blocks Tested | 1440 |
| Number of Reads on Partially-programmed Blocks | 55,101,073 |
| Number of Partially-programmed Block ECC Triggers | 161 |
| Partially-programmed Block Read ECC Trigger Rate | $2.9219 \times 10^{-6}$ |
| Number of Reads on Fully Programmed Blocks | 2,261,592,508 |

TABLE 1-continued

Partially-programmed vs Fully-programmed block read trigger rate

| RUNTIME | 20 HOURS |
|---|---|
| Number of Fully Programmed Block ECC Triggers | 1 |
| Fully Programmed Block Read ECC Trigger Rate | $4.4217 \times 10^{-10}$ |

In one embodiment, re-read triggers can be mitigated by adjusting the read voltages prior to reading vulnerable word lines, where vulnerable word lines are identified after determining a wordline-specific pattern of unsuccessful reads of partially-programmed blocks.

For example, in contrast to the 161 ECC triggers on open bands of partially-programmed blocks summarized in Table 1, adjusting the read voltages on the last 5 wordlines of a partially-programmed block measured after running the same workload on the same example drive, resulted in zero ECC triggers after 24 hours of runtime, as summarized in Table 2.

TABLE 2

Total re-read trigger rate with partially-programmed block adjusted read voltage

| RUNTIME | 24 HOURS |
|---|---|
| #Blocks Tested | 1440 |
| Total Number of Reads on all blocks | 2,453,604,634 |
| Total Number of ECC Triggers | 0 |
| ECC Trigger Rate | 0 |

As described in further detail below (see example in FIG. 6), a re-read trigger can occur significantly more-often on partially-programmed blocks due to the lack of floating gate-to-floating gate (FG-FG) coupling on the last wordlines of partially-programmed blocks. As a result, a read voltage based on the existence of FG-FG coupling can be incorrectly compensated on reads where it does not exist. Various embodiments described herein reduce re-read triggers on such partially-programmed blocks, including any blocks in which a wordline-specific pattern of re-read triggers can be determined, e.g., the last 4 programmed wordlines, the last 5 programmed wordlines, and so forth. Various embodiments can improve error recovery latency, quality of service, lifespan, and reliability of solid state drives (SSDs) or other memory devices that include block-addressable non-volatile memory, such as a laptop computer, a notebook computer, a netbook computer, a tablet, a smart phone, a server, a server array or server farm, a web server, a network server, a proxy device, a work station, a mini-computer, a main frame computer, a supercomputer, a network appliance, a web appliance, a distributed computing system, multiprocessor systems, processor-based systems, as well as devices such as a virtual reality or augment reality device, autonomous driving or flying vehicle, Internet-of-things (IoT) device, embedded electronics, a gaming console, and the like.

Various embodiments described herein can be used in any type of storage device that contains non-volatile memory. Non-volatile memory refers to memory whose state is determinate even if power is interrupted to the device. Storage devices that include non-volatile memory include a secure digital card, a multimedia card, a flash drive (for example, a Universal Serial Bus (USB) flash drive also known as a "USB thumb drive" or "USB memory stick" that includes non-volatile memory with an integrated USB interface), and a solid-state drive (SSD).

The non-volatile memory can comprise a block-addressable memory device, such as NAND, or more specifically, multi-threshold level NAND flash memory (for example, Single-Level Cell ("SLC"), Multi-Level Cell ("MLC"), Quad-Level Cell ("QLC"), Tri-Level Cell ("TLC"), Penta-Level Cell ("PLC"), or some other NAND), or non-volatile storage devices including 2, 4, 8, 16 levels of information, or other number of levels of information, and so forth. A NAND flash cell uses the threshold voltage of a floating-gate transistor to represent the data stored in the cell.

FIG. 1 illustrates a block diagram of an example computer system 100 that includes non-volatile memory in which an embodiment of read latency reduction for partially-programmed blocks can be implemented. In some examples, system 100 includes a host computing platform 110 coupled to a storage device 120 through input/output (I/O) interface 103 and I/O interface 121 and using communications link 130. Also, as shown in FIG. 1, host computing platform 110 can include an OS 111, one or more system memory device(s) 112, circuitry 116 and one or more application(s) 117. For these examples, circuitry 116 can be capable of executing various functional elements of host computing platform 110 such as OS 111 and application(s) 117 that can be maintained, at least in part, within system memory device(s) 112. Circuitry 116 can include host processing circuitry to include one or more central processing units (CPUs), processor cores, and associated chipsets and/or controllers.

In some examples, system memory device(s) 112 can store information and commands which can be used by circuitry 116 for processing information. Also, as shown in FIG. 1, circuitry 116 can include a memory controller 118. Memory controller 118 can be configured to control access to data at least temporarily stored at system memory device(s) 112 for eventual storage to storage memory device(s) 122 in storage device 120.

According to some examples, as shown in FIG. 1, OS 111 can include file system 113 or make use of a separate file system 113 to coordinate storage of data received from application(s) 117 in a file from among files 113-1 to 113-$n$, where "n" is any whole positive integer, in a memory device 122 of storage device 120. The data, for example, can have originated from or can be associated with executing application(s) 117 and/or OS 111.

As shown in FIG. 1, storage device 120 includes a controller 123 coupled with memory devices 122. According to some examples, controller 123 can receive and/or fulfill read/write requests via communication link 130 through I/O interface 121. Storage device 120 can be a memory device for host computing platform 110. As a memory device, storage device 120 can function as a solid state drive (SSD) for host computing platform 110 and the controller 123 can be an SSD controller.

In some examples, controller 123 can include an error correction code (ECC) encoder/decoder logic 124. ECC can include logic and/or features to generate codewords to protect regions of data to be written to memory 122 as well as logic and/or features to detect and attempt to correct errors included in an ECC encoded region of data. According to some examples, the ECC used to encode the data can include, but is not limited to, a low-density parity-check (LDPC) code, or in some cases, a Reed-Solomon (RS) code or a Bose, Chaudhuri, and Hocquenghem (BCH) code.

In one embodiment of read latency reduction for partially-programmed blocks, an SSD controller 123 can include a partially-programmed read logic 126. The partially-programmed read logic 126 can include logic and/or features to generate and store a wordline-specific pattern of unsuccessful reads and corresponding wordline offsets. The partially-programmed read logic 126 can include logic and/or features to use the wordline-specific pattern to determine whether a wordline undergoing a read operation is a vulnerable wordline. In addition, the partially-programmed read logic 126 can include logic and/or features to generate commands to affect the operation of a memory device 122, such as a command to affect a NAND operation of a NAND memory device, including a command to adjust or otherwise alter a read voltage when reading vulnerable wordlines in a 3D NAND flash memory array.

In some examples, as shown in FIG. 1, memory devices 122 can include memory devices 122-1 to 122-$m$, where "m" is any positive whole integer. For these examples, memory devices 122-1 to 122-$m$ can include non-volatile and/or volatile types of memory. Non-volatile types of memory can be types of memory whose state is determinate even if power is interrupted to the device. In some examples, memory devices 122-1 to 122-$m$ can be block-addressable memory devices, such as memory devices including NAND or NOR technologies. Memory devices 122-1 to 122-$m$ can also include non-volatile types of memory, such as 3D (Three-Dimensional) crosspoint memory (3D×P), or other byte addressable non-volatile memory. Memory devices 122-1 to 122-$m$ can include memory devices that use chalcogenide phase change material (e.g., chalcogenide glass), multi-threshold level NAND flash memory, NOR flash memory, single or multi-level phase change memory (PCM), a resistive memory, nanowire memory, ferroelectric transistor random access memory (FeTRAM), magneto resistive random access memory (MRAM) memory that incorporates memristor technology, or spin transfer torque MRAM (STT-MRAM), or a combination of any of the above, or other memory types.

According to some examples, volatile types of memory included in memory devices 122-1 to 122-$m$ and/or included in system memory device(s) 112 can include, but are not limited to, random-access memory (RAM), Dynamic RAM (D-RAM), double data rate synchronous dynamic RAM (DDR SDRAM), static random-access memory (SRAM), thyristor RAM (T-RAM) or zero-capacitor RAM (Z-RAM). Volatile types of memory can be compatible with a number of memory technologies, such as DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (LPDDR version 5, currently in discussion by JEDEC), HBM2 (HBM version 2, currently in discussion by JEDEC), and/or others, and technologies based on derivatives or extensions of such specifications.

In some examples, communications between file system 113 and controller 123 for writing or reading of regions of data stored in memory devices(s) 122 can be routed through I/O interface 103 and I/O interface 121. For example, to couple elements of host computing platform 110 to storage device 120, I/O interfaces 103 and 121 can be configured to comply with one or more of the following standards: a Serial Advanced Technology Attachment (SATA) interface, a Serial Attached Small Computer System Interface (SCSI) (or simply SAS), a Peripheral Component Interconnect Express (PCIe) interface, or a Non-Volatile Memory Express (NVMe) interface. Communication protocols can be utilized to communicate through I/O interfaces 103 and 123 as described in industry standards or specifications (including progenies or variants) such as the Peripheral Component Interconnect (PCI) Express Base Specification, revision 3.1, published in November 2014 ("PCI Express specification" or "PCIe specification") and/or the Non-Volatile Memory Express (NVMe) Specification, revision 1.2, also published in November 2014 ("NVMe specification").

Figure 2:
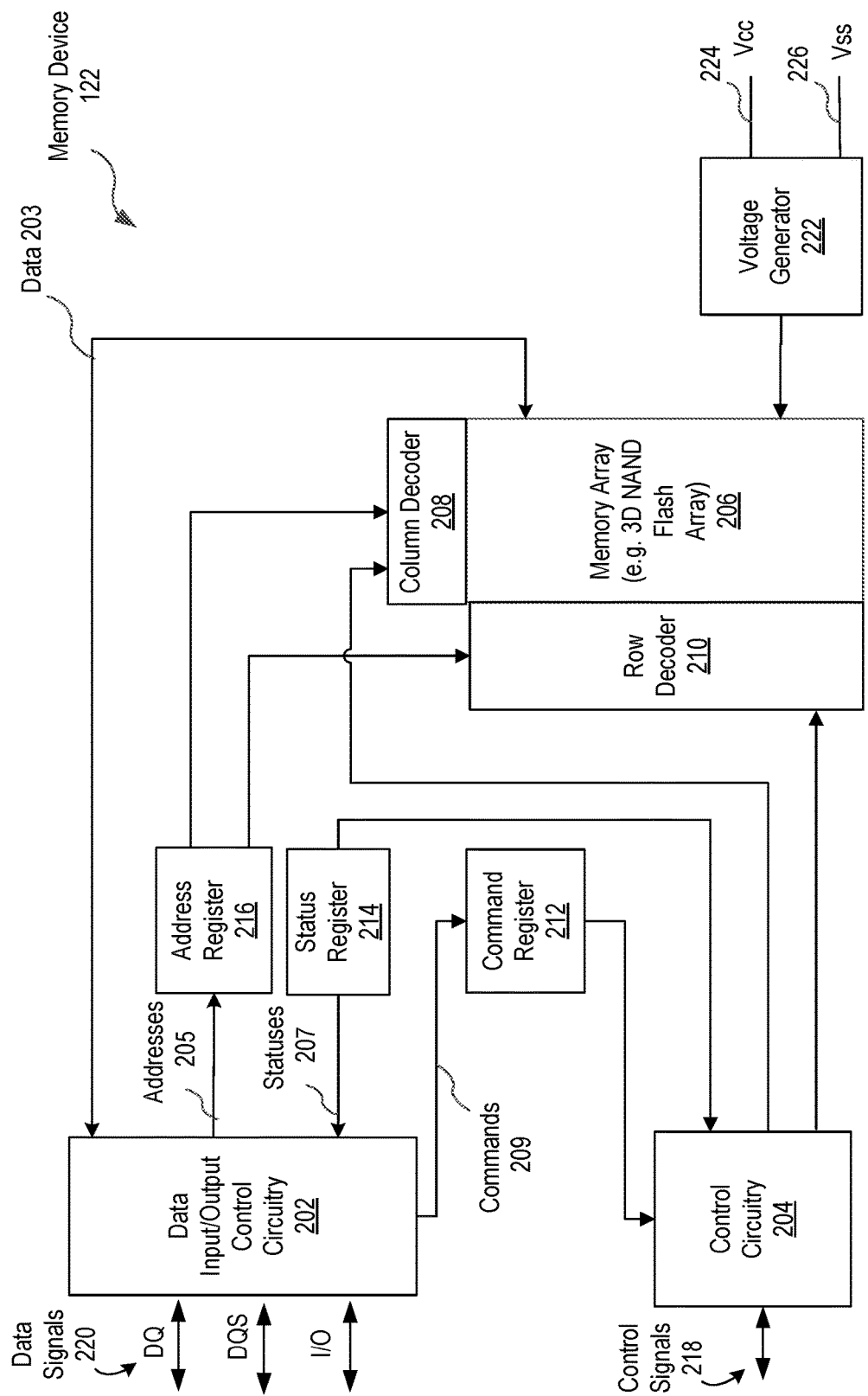
FIG. 2 illustrates a block diagram of an example memory device that includes non-volatile memory in which an embodiment of read latency reduction for partially-programmed blocks can be implemented.

FIG. 2 illustrates a block diagram of an example memory device 122 that includes block-addressable non-volatile memory in which an embodiment of read latency reduction for partially-programmed blocks can be implemented. The example memory device 122 includes example memory devices 122-1, 122-2 . . . 122-$m$ introduced in FIG. 1, collectively referred to herein as memory device 122. The example memory device 122 can be a 3D (Three-Dimensional) NAND device. The example memory device 122 can include Input/Output ("I/O") control circuitry 202 and control circuitry 204 that are coupled to a host memory controller (such as memory controller 118 in FIG. 1) and memory controller (such as SSD controller 123) via a plurality of control signals 218 and data signals 220. The example memory device 122 also includes a memory array 206, such as a 3D NAND flash array that includes a plurality of NAND memory cells organized in rows and columns.

In the example memory device 122, a row decoder 210 and a column decoder 208 are provided to decode address signals to access the memory array 206. The memory device 122 further includes the I/O control circuitry 202 to manage input of commands 209, addresses 205, and data 203 to the memory device 122 from the host memory controller 118 and SSD controller 123, as well as to manage the output of data 203 and status information 207 from the memory device 122 to the host memory controller 118 and SSD controller 123. An address register 216 is in communication with I/O control circuitry 202, and row decoder 210 and column decoder 208, to latch the address signals prior to decoding. A command register 212 is in communication with I/O control circuitry 202 and control circuitry 204 to latch incoming commands 209. A status register 214 is in communication with the I/O control circuitry 202 to provide the status information 207.

In the example memory device 122, control circuitry 204 controls access to the memory array 206 in response to the commands 209 and generates the status information 207. Control circuitry 204 is in communication with row decoder 210 and column decoder 208 to control the row decoder 210 and column decoder 208 in response to the addresses 205. Additionally, control circuitry 204 can issue erase commands that trigger activation of one or more high voltage transistors within row decoder 210 and column decoder 208. In other examples, the one or more high-voltage transistors are located separately from row decoder 210 and column decoder 208, such as within the 3D NAND flash array 206.

The example memory device 122 can also include a voltage generator 220. Memory device 122 can include nodes 224 and 226 to receive voltages Vcc and Vss, respectively, in voltage generator 222. Vcc is typically the supply voltage and the Vss is the ground. Voltage generator 220 and control circuitry 204 can act separately or together to provide different voltages to memory array 206 or to cause memory array 206 to have different voltages during various NAND operations of memory device 122. For example, the memory device 122 can include voltage control circuitry (not shown) to separately control the voltages of one or more wordlines in the memory array 206, where a wordline corresponds to a row of memory cells in the memory array 206. The NAND operations can include a programming operation to transfer or write data 203 to memory cells in memory array 206, a read operation to transfer or read data 203 from memory cells in memory array 206, and an erase operation to erase or clear data from all or a portion of memory cells in memory array 206. One skilled in the art will readily recognize that memory device 122 can include other parts, which are omitted from FIG. 2 to focus on the various embodiments described herein.

Generally, a NAND device such as memory device 122 uses fixed settings to optimize NAND operations and these settings are referred to as a "trim profile." As discussed herein, a trim profile generally refers to pre-defined setting(s) for non-volatile memory/NAND memory parameters. These settings are used for NAND operations. For example, a trim profile can include settings for parameters such as word line/bit line (WL/BL) voltages during array operations (e.g., program/erase/read/etc.), program verify levels, read reference values, maximum WL bias value, array operation timeout period, etc. The number of trim profiles available for a given memory device 122 can vary based on certain known characteristics of the memory device, such as its wear level, or aging, characteristics, or can be otherwise pre-defined. A trim profile can be stored in a storage unit, such as a non-volatile memory, in each NAND die of memory device 122 or can be stored in the NAND flash controller in the SSD, e.g. SSD controller 123 (FIG. 1). The NAND operations can include a trim operation to control the use of a trim profile or a NAND operation responsive to receiving a trim command to otherwise control settings for parameters such as WL/BL voltages during array operations.

The I/O control circuitry 202 in the memory device 122 communicates with the host memory controller 118 (FIG. 1) via a bidirectional data bus (DQ) and a bidirectional data strobe (DQS) signal 220. The DQS signal is used to indicate a data valid window. The control circuitry 204 in the memory device 122 receives control signals 218 from the host memory controller 118 and/or SSD controller 123. The control signals 218 that are received include chip enable (CE #) to select the memory device 122 for data transfer with the host memory controller 118, Address Latch Enable (ALE) to indicate the type of bus cycle (command, address or data), Command Latch Enable (CLE) to indicate the type of bus cycle (command, address or data), Read Enable (RE #), Write Enable (WE #), and Write Protect (WP #) to disable program and erase operations. The memory device 122 also includes control signals 218 output by control circuitry 204 that include a Ready/Busy (R/B #) signal to indicate whether the memory device 122 is executing a NAND operation ("busy") or is ready for a next NAND operation.

The Open NAND Flash Interface (ONFI) is an example of a standard that can define the operation of the data signals (bus) 220 and the control signals 218. The ONFI standard supports an 8-bit or 16-bit data bus (two independent 8-bit data buses) and up to four NAND die in a package.

It will be appreciated that the memory device 122 of FIG. 2 can include additional circuitry and signals not shown, and that the functional blocks of the memory device may not necessarily be segregated as shown in this example case. For example, a single component or component portion of an integrated circuit device could be adapted to perform the functionality of more than one block component of FIG. 2. Alternatively, or in addition, functionality of a single block component of FIG. 2 can be distributed into multiple blocks. As another example, a data input/output buffer (not shown) can be configured to at least temporarily store data written to or read from the memory array 206.

According to some examples, memory device 122 can be incorporated as an integrated system that includes control circuitry 202 and/or 204 on a single circuit board or other type of integrated packaging. For these examples, the integrated system can include a plurality of memory arrays 206 and associated control circuitry 202/204. The integrated system can be embedded as part of a computing platform or can be included in a type of configuration that can be removably coupled to a computing platform. This type of configuration can include all or some of the components of memory device 122 depicted in FIG. 2. Memory device 122 can be any single or multiple memory devices, e.g., 122-1, 122-2, . . . 122-$m$, each of which can be a single die or multiple dice.

Figure 3:
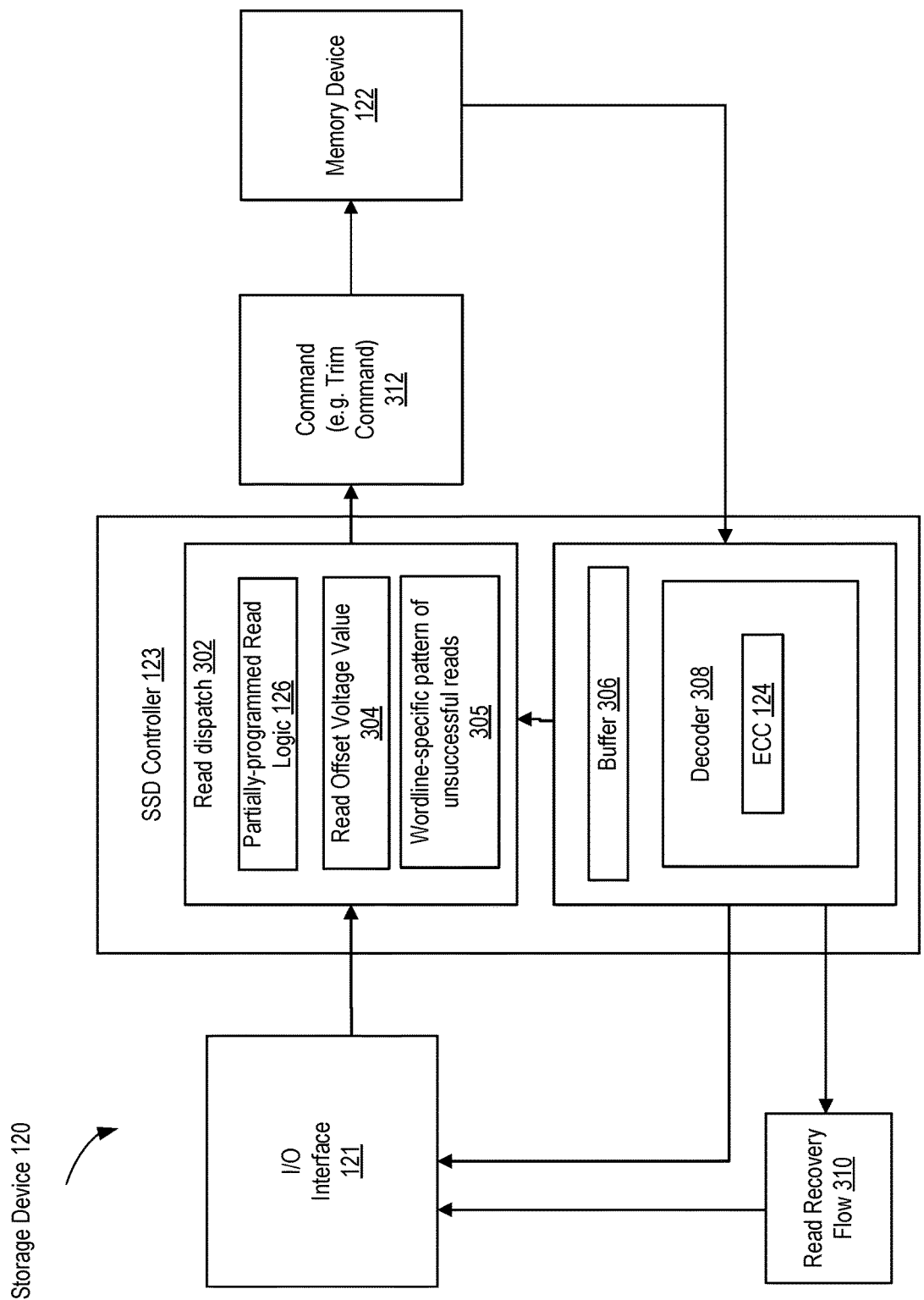
FIG. 3 illustrates a block diagram of an example storage device that includes non-volatile memory, and in which an embodiment of read latency reduction for partially-programmed blocks can be implemented.

FIG. 3 illustrates a block diagram of an example storage device 120 that includes a memory device 122, and in which an embodiment of read latency reduction for partially-programmed blocks can be implemented. Embodiments of read latency reduction can be used to determine whether to adjust a read voltage in a memory device 122 prior to processing a read operation. The read voltage can be adjusted in the context of reading or re-reading data from a plane, block, page or other region of memory from a memory device 122 or die. Embodiments of read latency reduction in example storage device 120 can be applied to parallel read or re-read operations on a plane, block, page or other region of memory from a memory device 122 or die. Various embodiments can be used in a pre-read operation in connection with a program operation on a memory array 206 in the memory device 122.

In anticipation that a region of the memory device is likely to be re-read because of past errors in read data or unsuccessful recovery of the read data, embodiments of read latency reduction can select a read offset voltage value to proactively apply to the read voltage prior to performing a read operation in the memory device 122. The likelihood that a region of the memory device will need to be re-read is based on whether the region of memory comprises one or more vulnerable wordlines of a partially-programmed block.

In the event that a read voltage is adjusted using a read offset voltage value, various embodiments include restoring the initially selected read voltage at the conclusion of the read operation. The read offset voltage value for a data read from the memory device 122 can be chosen based on a read offset voltage that yielded a read success in the same plane, block, page or other region of memory from a memory device or die. Various techniques for determining when to proactively apply a read offset voltage value, or otherwise adjust the read voltage in anticipation of a possible re-read trigger, are described herein.

In the example storage device 120, a controller, such as SSD controller 123, is configured with, among other components, a read dispatch 302 logic that includes a partially-programmed read logic 126, a read offset voltage value 304 and a wordline-specific pattern of unsuccessful reads 305 to implement read latency reduction in accordance with embodiments described herein.

In the example storage device 120, an interface 121 to a host computing platform 110 (FIG. 1) can receive data read or write requests (e.g., commands, synchronization signals, data, and/or meta data) for data stored in a memory array 206 of a memory device 122. A read request triggers a determination of whether to adjust a read voltage to apply to a memory device 122 before attempting a read operation. In response, the partially-programmed read logic 126 in controller 123 determines not only whether an adjustment to a read voltage is needed before attempting the read operation, but also causes the memory device 122 to adjust the read voltage in accordance with any of the examples described herein.

For example, in response to a request received through interface 121 to initiate a read operation, read dispatch logic 302 provides an initial read voltage level to apply to read operation in memory device 122. Partially-programmed read logic 126 is invoked to determine whether to proactively adjust the read voltage for the read operation when it occurs on a vulnerable wordline, the processes for which are described in further detail in FIGS. 4A-4B. To identify whether a read operation might occur on a vulnerable wordline, the partially-programmed read logic 126 compares the wordline offsets of the current read operation to a previously determined wordline-specific pattern 305 of past unsuccessful read operations (as described in more detail in FIG. 6). If so determined, the partially-programmed read logic 126 applies a read offset voltage value 304 to a read reference voltage value (not shown), where the sum of the read reference voltage value offset by the read offset voltage value is provided as an adjusted read voltage value provided to memory device 122. In one example, the SSD controller 123 provides any of the read offset voltage value 304 and the adjusted read voltage value to the memory device 122 in a command 312 generated and transmitted to the memory device 122, such as a trim command, via control circuitry 202 and control circuitry 204 and command register 212 (FIG. 2).

In one example, the read offset voltage value 304 can represent voltage levels or can be translated into voltage levels. For example, a read offset voltage value 304 of "5" can correspond to "5" mV or be translated into a voltage level, such as 37.5 mV. In another example, instead of an offset to a reference read voltage, the read offset voltage value 304 can represent the actual read voltage to be applied to a wordline in the memory array 206 of memory device 122.

In a first attempt to read data from memory array 206 in memory device 122, a read reference offset value can be selected based on an offset voltage that previously led to a read success on the memory device 122 in a same or overlapping plane, page block, or region of memory. In some cases, for example where no prior read success was achieved, or no read attempted, an initial read voltage can be pre-determined.

During operation of the example storage device 120 implementing read latency reduction, a buffer 306 can store data retrieved from a memory device 122 in connection with a read operation, such as a NAND read operation. A ECC decoder 308 of an ECC component 124 can decode retrieved data from stored codewords to determine if the data was successfully recovered. In addition, the ECC decoder 308 can attempt to correct error(s) in retrieved data as needed. A read recovery flow logic 310 can provide for recovery of data in the event of a data read failure. However, as a result of the advantages provided by proactively adjusting read voltages for partially-programmed blocks using the partially-programmed read logic 126 as herein described, a reduction in the re-read trigger rate can reduce the rate of entry into the read recovery flow logic 310 and, in some cases, eliminate entry altogether.

Figure 4A:
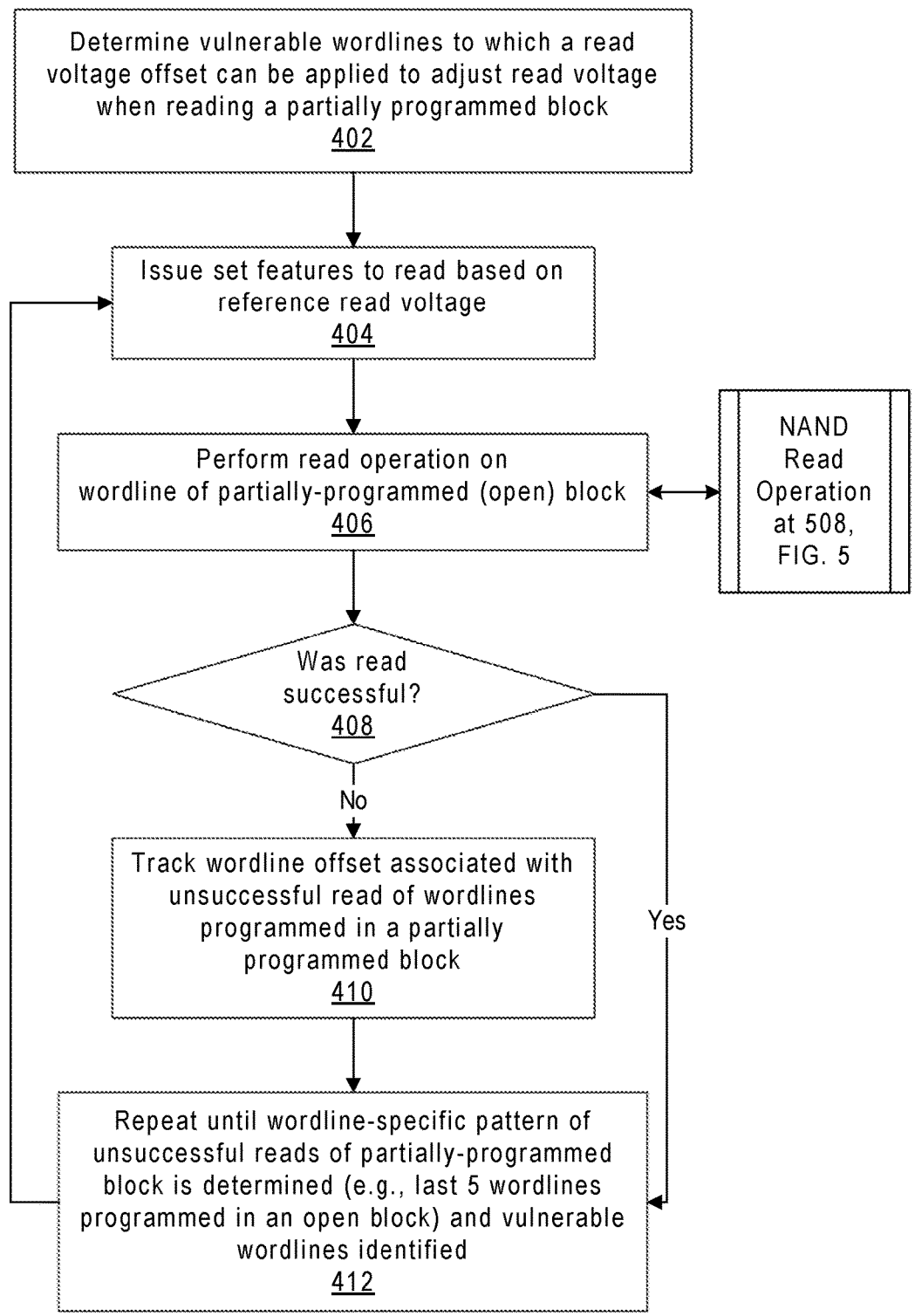
FIGS. 4A-4B illustrate flow diagrams of example storage device processes that can be used to implement an embodiment of read latency reduction for partially-programmed blocks in the example system and devices illustrated in FIGS. 1-3.
Figure 4B:
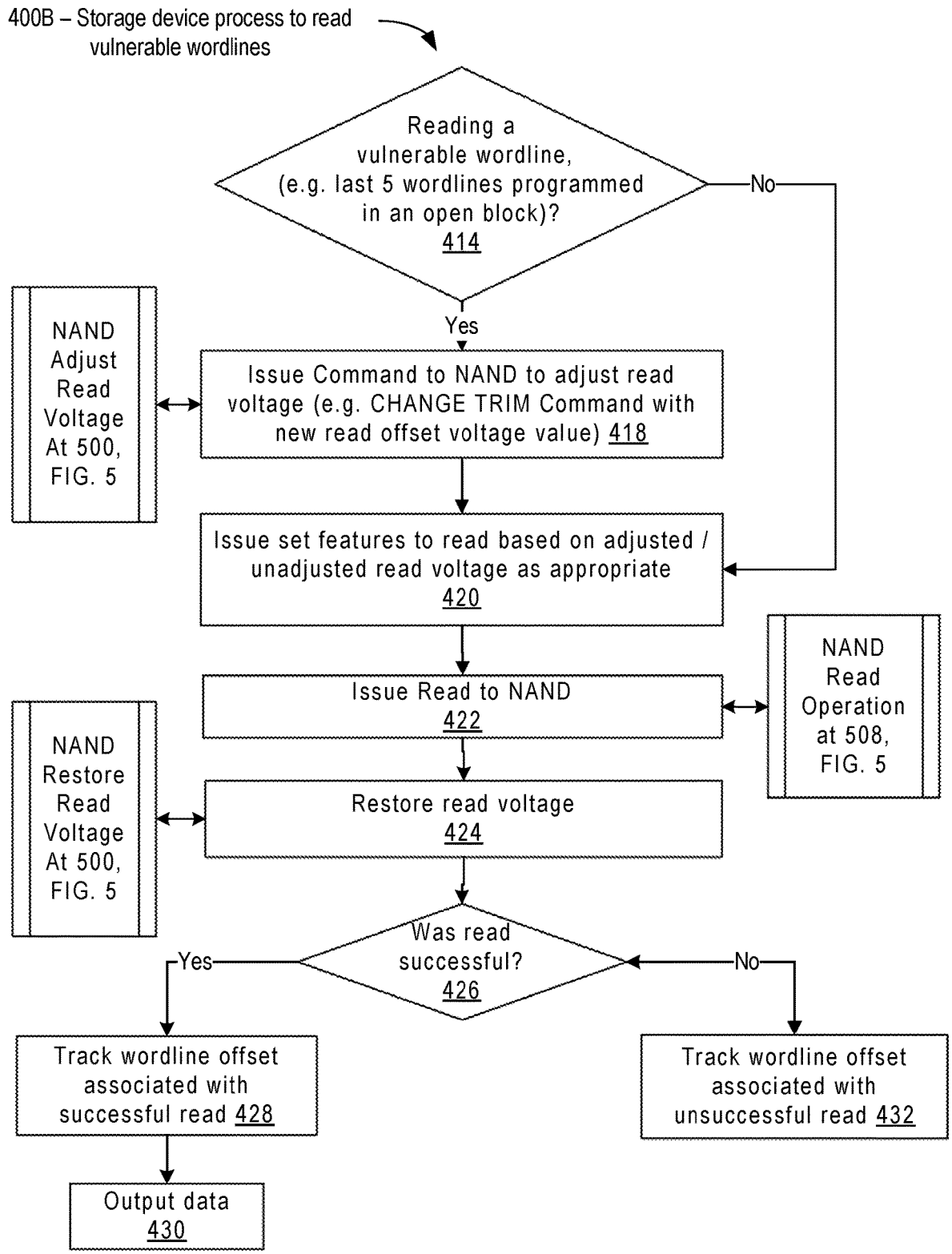

FIGS. 4A-4B illustrate flow diagrams of example storage device processes that can be used to implement an embodiment of read latency reduction for partially-programmed blocks in the example system and devices illustrated in FIGS. 1-3. Specifically, FIG. 4A illustrates storage device process 400A to determine a vulnerable wordline pattern in a memory array of a memory device using, for example, the partially-programmed read logic 126. Once determined, the vulnerable wordline pattern can be used to further determine whether there are vulnerable wordlines in a partially-programmed block in need of proactive adjustment of a read voltage in advance of performing a read or re-read operation in a memory device. The process 400A can be applied or requested to be applied by a memory device controller, a storage device controller or a host computing platform device. In one embodiment, the process 400A can be implemented in firmware on the storage device controller. During the read path, the storage device controller firmware can determine if a read operation is to be performed on a vulnerable wordline. If so, the read voltage in the memory device will be proactively adjusted in advance of performing the read operation. For example, the read voltage can be adjusted using values pre-determined for a NAND memory device and made available as a NAND policy. After the read operation is completed, the read voltages can be restored to the original unadjusted values.

As illustrated in FIG. 4A, one or more components of storage device 120 can perform process 400A, such as the storage controller 123. At 402, the process 400A empirically determines an initial number of vulnerable wordlines to which a read offset voltage value can be applied to adjust a read voltage when reading a partially-programmed block. For example, at 404 one or more components of storage device 120 can issue set features to read based on a reference read voltage, followed at 406 by causing the memory device to perform a read operation on a wordline of an open block, i.e., a partially-programmed block (at 508, FIG. 5B). At 408, after the storage device 120 empirically determines that the read operation was unsuccessful, the process 400A continues at 410 to track a wordline offset associated with an unsuccessful read operation of wordlines programmed in a partially-programmed block. A wordline offset indicates a relative location of a programmed wordline in a block of memory, e.g., the last wordline programmed in the block, the second-to-last wordline programmed in the block, the third-to-last wordline programmed in the block, and so forth. At 412, the process 400A repeats the empirical determination of vulnerable wordlines until a wordline-specific pattern of past unsuccessful reads and corresponding wordline offsets of a partially-programmed block is revealed (e.g., last 5 wordlines programmed in an open block). The wordline-specific pattern of past unsuccessful reads and corresponding wordline offsets is stored in the storage device to aid in the identification of vulnerable wordlines for subsequent read operations.

In some embodiments, rather than an empirical determination of vulnerable wordlines, the process 400A can be parameterized to accept a pre-determined value representing the wordline-specific pattern of wordlines that are considered vulnerable, such as a value of "5" to represent the last 5 wordlines programmed in a partially-programmed block.

Turning now to FIG. 4B, another storage device process 400B determines, at decision block 414, whether the storage device 120 has been requested to read a vulnerable wordline in a partially-programmed block as identified based on a wordline-specific pattern of past unsuccessful reads and corresponding wordline offsets or a parameter representing vulnerable wordlines, e.g., one of the last 5 wordlines programmed in an open block, as previously determined using the process 400A of FIG. 4A. If not, then at 416, the process 400B issues a command to the memory device, e.g., the NAND device, to adjust the read voltage (at 500, FIG. 5A). For example, the process 400B at 416 can issue a trim command to the NAND device with a read voltage offset value that can be used in the NAND to adjust the read voltage. Once the read voltage has been adjusted, the process 400B continues at 420 issuing set features to read based on the adjusted read voltage (or unadjusted read voltage for wordlines not identified as vulnerable). At 422, the process 400 continues, issuing a read operation command to the memory device to perform the read operation with the applicable read voltage (at 508, FIG. 5B). At 424, the original (default) read voltage is restored, ensuring that the next read after a read operation on a vulnerable wordline uses the original unadjusted read voltage unless again adjusted at 418. For example, the storage controller can command the memory device to restore the original (default) read voltage upon completion of a successful read operation on a vulnerable wordline.

Various embodiments of process 400B can include, at 426, a continuous determination as to whether a read operation was successful and, if not, at 432, tracking the wordline offset associated with the unsuccessful read. Likewise, at 428, various embodiments of process 400 can include, at 428, tracking the wordline offset associated with a successful read, after which the process 400B performs, at 430, an operation to output the data obtained during the successful read. A continuous determination as to whether a read was successful and tracking the wordline offset associated with the unsuccessful/successful reads, can be used to update the wordline-specific pattern of unsuccessful reads and corresponding wordline offsets on the storage device 120 to aid in identifying vulnerable wordlines for subsequent read operations.

Figure 5A:
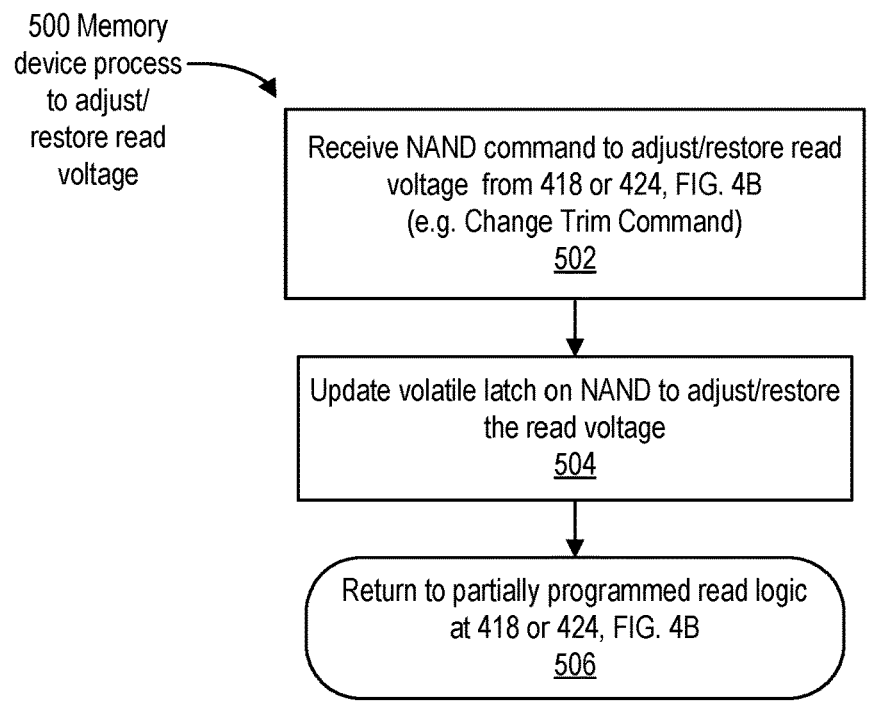
FIGS. 5A-5B illustrate flow diagrams of example memory device processes that can be used to implement an embodiment of read latency reduction for partially-programmed blocks in the example system, devices and processes illustrated in FIGS. 1-3 and 4A-4B.
Figure 5B:
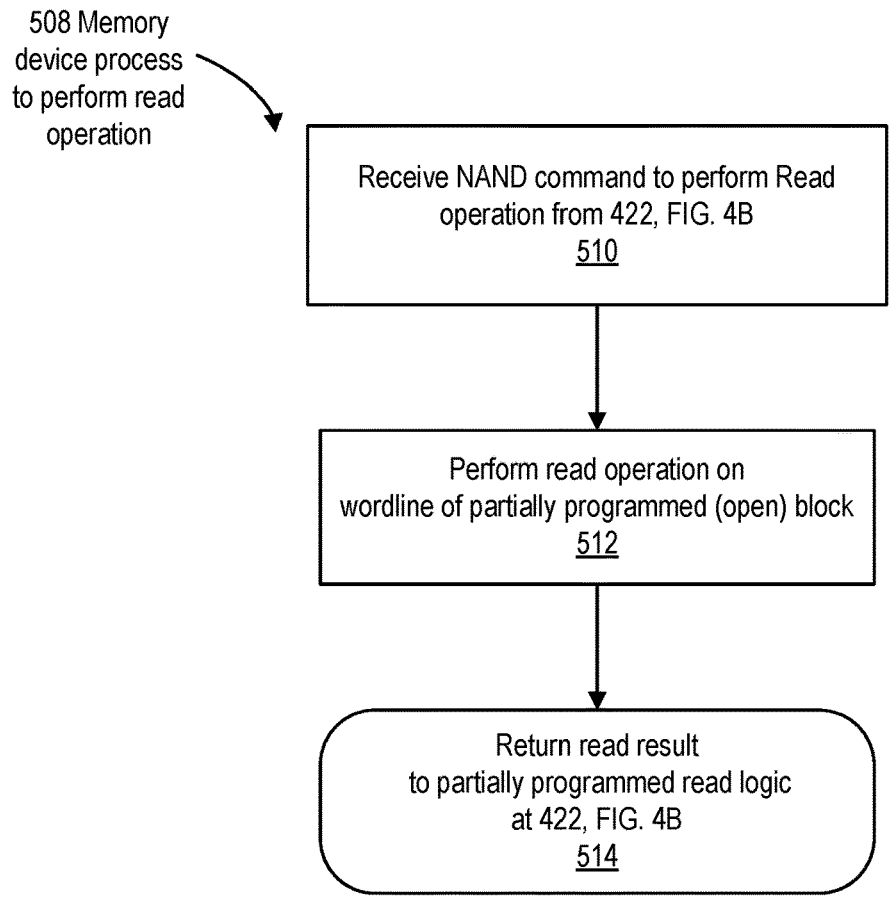

FIGS. 5A-5B illustrate flow diagrams of example memory device processes that can be used to implement an embodiment of read latency reduction for partially-programmed blocks in the example system, devices and processes illustrated in FIGS. 1-3 and 4A-4B. Specifically, FIG. 5A illustrates memory device process 500 in which a memory device receives a NAND command at 502 to adjust or restore a read voltage. The NAND command is received from the storage device process described in FIG. 4B and instructs the memory device to either adjust or restore the read voltage. In one embodiment, the NAND command can be a change trim command generated by the storage device as described in FIG. 4B. At 504, the memory device updates the volatile latch to adjust/restore the read voltage for subsequent read operations. At 506, the memory device returns control to the partially-programmed read logic, at 418 or 424 in FIG. 4B.

FIG. 5B illustrates memory device process 508 in which a memory device receives a NAND command at 510 to perform a read operation. The NAND command is received from 422 in FIG. 4B. At 512, the memory device performs the read operation on a wordline of a partially-programmed (open) block using the read voltage that has been proactively adjusted in anticipation of reading a vulnerable wordline in the memory array of the memory device as described in process 500, FIG. 5A. At 514, the memory device returns control to the partially-programmed read logic at 422, FIG. B.

FIG. 6 illustrates an example of re-read trigger rates by wordline offsets. Referring back to the media qualification test results of the example drive introduced earlier, it was revealed that a total of 161 ECC triggers occurred on open bands of partially-programmed blocks, as summarized in Table 1. As shown in the wordline offset table illustrated in FIG. 6, the wordline offsets with the highest ECC error rates comprise a wordline-specific pattern 602 that reveals that the most vulnerable wordlines are the last 4 programmed wordlines, e.g., wordlines at wordline offset 0, 1, 2 and 3. Unless adjusted, it can be predicted that a default or initial read voltage applied to vulnerable wordlines associated with any of the wordline offsets 0, 1, 2 and 3 will cause an increase in the re-read trigger rates. Accordingly, it is this wordline-specific pattern 602 that can be determined and stored in the storage device 120 using partially-programmed read logic 126 to proactively adjust the read voltages used to perform the read operations in the memory device, resulting in a reduction of the re-read trigger rates in accordance with the example devices and processes illustrated in FIGS. 1-3, 4A-4B and 5A-5B.

The wordline-specific pattern 602 reveals that re-read triggers occur significantly more often on partially-programmed blocks, likely because of the lack of floating gate-to-floating gate (FG-FG) coupling on the most recently programmed wordlines of partially-programmed blocks. Because an initial (default) read voltage is based on the existence of FG-FG coupling, the read voltage can be incorrectly compensated on reads where FG-FG coupling does not exist. Of course, other wordline-specific patterns other than the [0, 1, 2, 3] pattern 602 illustrated in FIG. 6 can emerge, particularly as a device ages. Although the wordline-specific patterns are usually contiguous, various embodiments could determine other wordline-specific patterns to identify vulnerable wordlines. For example, various embodiments can also employ one or more thresholds, cutoffs, or the like, for any one or more of the #Reads, #Reads w/ECC Errors and ECC Error Rate criteria illustrated in FIG. 6 in order to determine which wordline offsets comprise a wordline-specific pattern 602. Only those wordline offsets that meet the thresholds will be used to identify wordlines that are considered vulnerable. Lastly, various embodiments can dynamically update the wordline-specific pattern 602 as needed to accurately identify vulnerable wordlines that can benefit from read voltage adjustment in accordance with the example systems, devices and processes illustrated in FIGS. 1-3, 4A-4B and 5A-5B.

Figure 7:
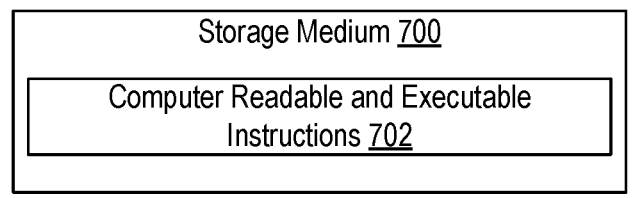
FIGS. 7-9 illustrate block diagrams of an example storage medium, storage device and computing platform that can be used to implement an embodiment of read latency reduction for partially-programmed blocks in the example system, devices and processes illustrated in FIGS. 1-3, 4A-4B, 5A-5B and 6.

FIG. 7 illustrates an embodiment of a storage medium 700. The storage medium 700 can include an article of manufacture. In some examples, storage medium 700 can include any non-transitory computer readable medium or machine readable medium, such as an optical, magnetic or semiconductor storage. Storage medium 700 can store various types of computer executable instructions, such as instructions to implement the processes described herein. Examples of a computer readable or machine-readable storage medium can include any tangible media capable of storing electronic data, including volatile memory or non-volatile memory, removable or non-removable memory, erasable or non-erasable memory, writeable or re-writeable memory, and so forth. Examples of computer executable instructions can include any suitable type of code, such as source code, compiled code, interpreted code, executable code, static code, dynamic code, object-oriented code, visual code, and the like.

Figure 8:
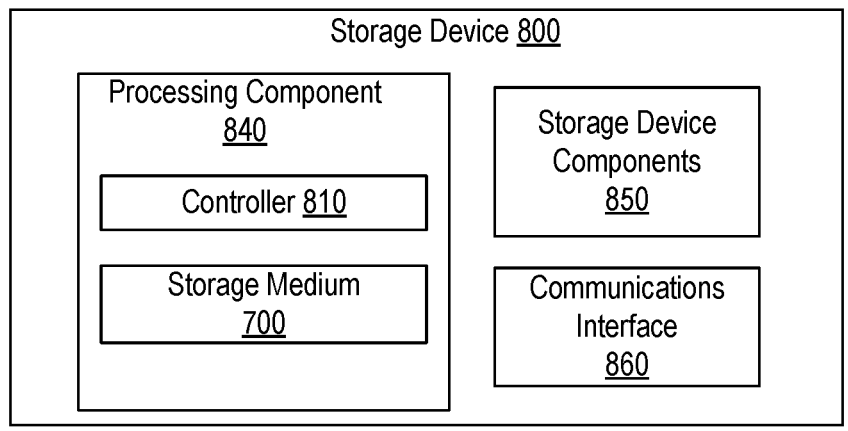

FIG. 8 illustrates an example storage device 800. In some examples, as shown in FIG. 8, storage device 800 can include a processing component 840, storage device components 850, and a communications interface 860, as well as host a storage medium 700. According to some examples, storage device 800 can be capable of being coupled to a host computing device or platform via the communications interface 860.

According to some examples, processing component 840 can execute processing operations or logic for a storage controller 810, or for other components 850 of the storage device and storage medium 700, and/or any activity described herein. Processing component 840 can include various hardware elements, firmware elements and software elements, or a combination of both.

In some examples, storage device components 850 can include common computing elements or circuitry, such as one or more processors, multi-core processors, co-processors, memory units, chipsets, controllers, interfaces, oscillators, timing devices, power supplies, and so forth. Examples of memory units can include without limitation various types of computer readable and/or machine-readable storage media any other type of volatile or non-volatile storage media suitable for storing information.

In some examples, communications interface 860 can include logic and/or features to support a communication interface. For these examples, communications interface 860 can include one or more communication interfaces that operate according to various communication protocols or standards to communicate over wired or wireless communication links.

Storage device 800 can be configured as an SSD that can be configured as described above for storage device 120 of system 100 as shown in FIG. 1. Accordingly, functions and/or specific configurations of storage device 800 described herein, can be included or omitted in various embodiments of storage device 800, as suitably desired.

Figure 9:
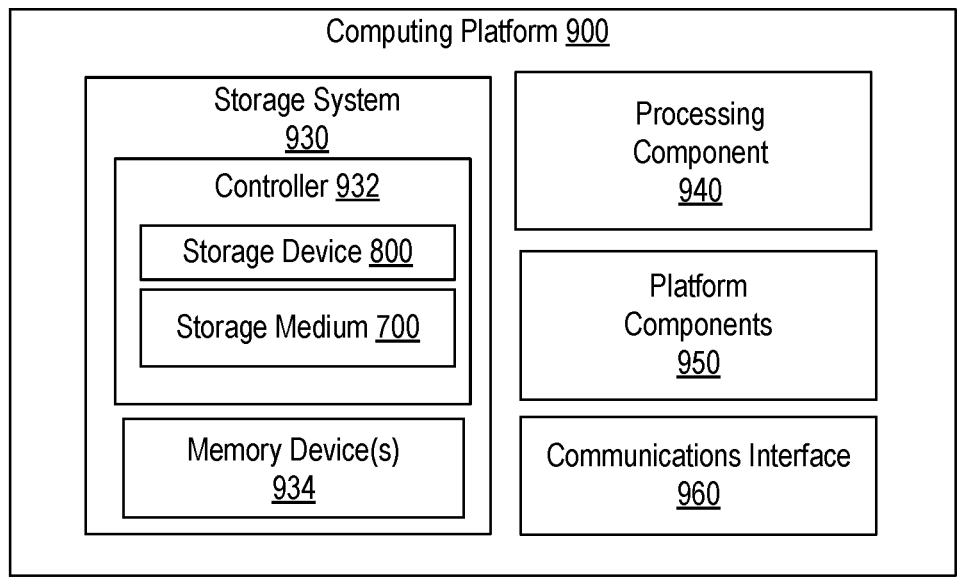

FIG. 9 illustrates an example computing platform 900. In some examples, as shown in FIG. 9, computing platform 900 can include one or more of: a storage system 930, a processing component 940, platform components 950, or a communications interface 960.

According to some examples, storage system 930 can be similar to the storage device 120 of system 100 as shown in FIG. 1 and includes a controller 932 and memory devices(s) 934. For these examples, logic and/or features resident at or located at controller 932 can execute at least some processing operations or logic for the storage medium 700, storage device 800, or any other activities described herein. Also, memory device(s) 934 can include similar types of volatile or non-volatile memory (not shown) that are described above for memory device 122.

According to some examples, processing component 940 can include various hardware elements, firmware elements, software elements, or a combination thereof. In some examples, platform components 950 can include common computing elements, such as one or more processors, single or multi-cores, co-processors, memory units, chipsets, controllers, peripherals, interfaces, oscillators, timing devices, video cards, audio cards, multimedia I/O components (e.g., digital displays), power supplies, and so forth. Examples of memory units associated with either platform components 950 or storage system 930 can include without limitation, various types of computer readable and machine-readable storage media.

In some examples, communications interface 960 can include logic and/or features to support a communication interface. For these examples, communications interface 960 can include one or more communication interfaces that operate according to various communication protocols or standards to communicate over direct or network communication links. Direct communications can occur through a direct interface via use of communication protocols or standards described in one or more industry standards (including progenies and variants) such as those associated with the SMBus specification, the PCIe specification, the NVMe specification, the SATA specification, SAS specification or the USB specification.

Communications interface 960 can include radio frequency (RF) transceiver components for accessing wireless voice and/or data networks (e.g., using cellular telephone technology, data network technology such as 3G, 4G/LTE, Wi Fi, other IEEE 802.11 family standards, or other mobile communication technologies, or any combination thereof), components for short range wireless communication (e.g., using Bluetooth and/or Bluetooth LE standards, NFC, etc.), and/or other components. In some embodiments, communications interface 960 can provide wired network connectivity (e.g., Ethernet) in addition to or instead of a wireless interface. Communications interface 960 can be implemented using a combination of hardware (e.g., driver circuits, antennas, modulators/demodulators, encoders/decoders, and other analog and/or digital signal processing circuits) and software components. In some embodiments, communications interface 960 can support multiple communication channels concurrently or at different times, using the same transport or different transports.

Computing platform 900 can be part of a computing device that can be, for example, user equipment, a computer, a personal computer (PC), a desktop computer, a laptop computer, a notebook computer, a netbook computer, a tablet, a smart phone, virtual reality or augment reality device, autonomous driving or flying vehicle, Internet-of-things (IoT) device, embedded electronics, a gaming console, a server, a server array or server farm, a web server, a network server, a proxy device, a work station, a minicomputer, a main frame computer, a supercomputer, a network appliance, a web appliance, a distributed computing system, multiprocessor systems, processor-based systems, or combination thereof. Accordingly, functions and/or specific configurations of computing platform 900 described herein, can be included or omitted in various embodiments of computing platform 900, as suitably desired.

The components and features of computing platform 900 can be implemented using any combination of discrete circuitry, ASICs, field programmable gate arrays (FPGAs), logic gates and/or single chip architectures. Further, the features of computing platform 900 can be implemented using microcontrollers, programmable logic arrays and/or microprocessors or any combination of the foregoing where suitably appropriate. It is noted that hardware, firmware and/or software elements can be collectively or individually referred to herein as "logic", "circuit" or "circuitry."

The appearances of the phrase "one example" or "an example" are not necessarily all referring to the same example or embodiment. Any aspect described herein can be combined with any other aspect or similar aspect described herein, regardless of whether the aspects are described with respect to the same figure or element.

Some examples can be described using the expression "coupled" and "connected" along with their derivatives. These terms are not necessarily intended as synonyms for each other. For example, descriptions using the terms "connected" and/or "coupled" can indicate that two or more elements are in direct physical or electrical contact with each other. The term "coupled," however, can also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events.

Disjunctive language such as the phrase "at least one of X, Y, or Z," unless specifically stated otherwise, is otherwise understood within the context as used in general to present that an item, term, etc., can be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

Additional example implementations are as follows:

Example 1 is any of a method, system, apparatus or computer-readable medium for read latency reduction for partially programmed blocks of memory comprising a memory device and a controller coupled to the memory device, the controller including logic to identify one or more vulnerable wordlines in the memory device likely to result in an unsuccessful read operation, select a read offset voltage value for a read operation in the memory device, cause the memory device to proactively adjust a read voltage with the read offset voltage value prior to performance of the read operation on any of the one or more vulnerable wordlines, and cause the memory device to perform the read operation on any of the one or more vulnerable wordlines with an adjusted read voltage.

Example 2 is any of the method, system, apparatus or computer-readable medium of Example 1 wherein the one or more vulnerable wordlines likely to result in an unsuccessful read operation are located in a partially-programmed block on non-volatile memory in the memory device, including at least one wordline most recently programmed in the partially-programmed block.

Example 3 is any of the method, system, apparatus or computer-readable medium as in any of Examples 1 and 2, wherein the one or more vulnerable wordlines identified as likely to result in an unsuccessful read operation are characterized by a lack of floating-gate to floating-gate coupling as a result of having been programmed in a partially-programmed block.

Example 4 is any of the method, system, apparatus or computer-readable medium as in any of Examples 1 through 3, wherein to identify the one or more vulnerable wordlines likely to result in an unsuccessful read operation, the controller including logic to track wordline offsets associated with past unsuccessful read operations on wordlines programmed in a partially-programmed block, determine a wordline-specific pattern of tracked wordline offsets associated with past unsuccessful read operations, and identify wordlines matching the wordline-specific pattern of tracked wordline offsets as vulnerable wordlines in advance of a read operation in the memory device.

Example 5 is any of the method, system, apparatus or computer-readable medium as in any of Examples 1 through 4, wherein the unsuccessful read operation includes any one or more of an unsuccessful read of data from the memory device and an unsuccessful error recovery of data from the memory device.

Example 6 is any of the method, system, apparatus or computer-readable medium as in any of Examples 1 through 5, wherein the read offset voltage value is predetermined based on a characteristic of the memory device, including a performance characteristic associated with an error rate of the memory device.

Example 7 is any of the method, system, apparatus or computer-readable medium as in any of Examples 1 through 6, wherein the read voltage offset value is selected from a set of available read offset voltage values.

Example 8 is any of the method, system, apparatus or computer-readable medium as in any of Examples 1 through 7, wherein the memory device is a three-dimensional NAND memory device having a memory array of memory cells, a wordline corresponding to a row of memory cells and the read operation is a NAND read operation performed on the wordline corresponding to the row of memory cells.

Example 9 is any of the method, system, apparatus or computer-readable medium as in any of Examples 1 through 8, wherein to cause the memory device to proactively adjust the read voltage with the read offset voltage value prior to performance of the read operation on any of the one or more vulnerable wordlines, the controller including logic to generate a command to the memory device to adjust the read voltage, the command including the read offset voltage value, transmit the command to the memory device prior to performance of the read operation on any of the one or more vulnerable wordlines, and cause the memory device to restore the read voltage to an unadjusted read voltage after performance of the read operation on any of the one or more vulnerable wordlines.

Example 10 is any of the method, system, apparatus or computer-readable medium as in any of Examples 1 through 9, wherein the command is a trim command to adjust the read voltage based on a trim profile stored in the memory device.

What is claimed is:

1. An apparatus comprising:
a memory device; and
a controller coupled to the memory device, the controller including logic to:
identify one or more vulnerable wordlines in the memory device likely to result in an unsuccessful read operation as characterized by a lack of floating-gate to floating-gate coupling as a result of having been programmed in a partially-programmed block,
select a read offset voltage value for a read operation in the memory device,
cause the memory device to proactively adjust a read voltage with the read offset voltage value prior to performance of the read operation on any of the one or more vulnerable wordlines, and
cause the memory device to perform the read operation on any of the one or more vulnerable wordlines with an adjusted read voltage.

2. The apparatus as in claim 1, wherein the one or more vulnerable wordlines likely to result in an unsuccessful read operation are located in the partially-programmed block on non-volatile memory in the memory device, including at least one wordline most recently programmed in the partially-programmed block.

3. The apparatus as in claim 1, wherein to identify the one or more vulnerable wordlines likely to result in an unsuccessful read operation, the controller including logic to:
track wordline offsets associated with past unsuccessful read operations on wordlines programmed in a partially-programmed block;

determine a wordline-specific pattern of tracked wordline offsets associated with past unsuccessful read operations; and identify wordlines matching the wordline-specific pattern of tracked wordline offsets as vulnerable wordlines in advance of a read operation in the memory device.

4. The apparatus as in claim 3, wherein the unsuccessful read operation includes any one or more of an unsuccessful read of data from the memory device and an unsuccessful error recovery of data from the memory device.

5. The apparatus as in claim 1, wherein the read offset voltage value is predetermined based on a characteristic of the memory device, including a performance characteristic associated with an error rate of the memory device.

6. The apparatus as in claim 5, wherein the read voltage offset value is selected from a set of available read offset voltage values.

7. The apparatus as in claim 1, wherein the memory device is a three-dimensional NAND memory device having a memory array of memory cells, a wordline corresponding to a row of memory cells and the read operation is a NAND read operation performed on the wordline corresponding to the row of memory cells.

8. The apparatus as in claim 1, wherein to cause the memory device to proactively adjust the read voltage with the read offset voltage value prior to performance of the read operation on any of the one or more vulnerable wordlines, the controller including logic to:

generate a command to the memory device to adjust the read voltage, the command including the read offset voltage value;

transmit the command to the memory device prior to performance of the read operation on any of the one or more vulnerable wordlines; and cause the memory device to restore the read voltage to an unadjusted read voltage after performance of the read operation on any of the one or more vulnerable wordlines.

9. The apparatus as in claim 8, wherein the command is a trim command to adjust the read voltage based on a trim profile stored in the memory device.

10. A computer-implemented method comprising, in a processor of a memory device, logic for:

identifying one or more vulnerable wordlines in the memory device likely to result in an unsuccessful read operation, wherein the one or more vulnerable wordlines are any one or more of:

located in a partially-programmed block, including at least one wordline most recently programmed in the partially-programmed block, and characterized by a lack of floating-gate to floating-gate coupling as a result of having been programmed in the partially-programmed block;

selecting a read offset voltage value for a read operation in the memory device;

causing the memory device to proactively adjust a read voltage with the read offset voltage value prior to performance of the read operation on any of the one or more vulnerable wordlines;

causing the memory device to perform the read operation on any of the one or more vulnerable wordlines with an adjusted read voltage; and wherein the logic for identifying the one or more vulnerable wordlines likely to result in an unsuccessful read operation includes:

tracking wordline offsets associated with past unsuccessful read operations on wordlines programmed in a partially-programmed block, determining a wordline-specific pattern of tracked wordline offsets associated with past unsuccessful read operations, and identifying wordlines matching the wordline-specific pattern of tracked wordline offsets as vulnerable wordlines in advance of a read operation in the memory device.

11. The computer-implemented method as in claim 10, wherein the unsuccessful read operation includes any one or more of an unsuccessful read of data from the memory device and an unsuccessful error recovery of data from the memory device.

12. The computer-implemented method as in claim 10, wherein any one or more of:

the read offset voltage value is predetermined based on a characteristic of the memory device, including a performance characteristic associated with an error rate of the memory device; and the read voltage offset value is selected from a set of available read offset voltage values.

13. The computer-implemented method as in claim 10, wherein the memory device is a three-dimensional NAND memory device having a memory array of memory cells, a wordline corresponding to a row of memory cells and the read operation is a NAND read operation performed on the wordline corresponding to the row of memory cells.

14. The computer-implemented method as in claim 10, wherein the logic for causing the memory device to proactively adjust the read voltage with the read offset voltage value prior to performance of the read operation on any of the one or more vulnerable wordlines, includes logic for:

generating a command to the memory device to adjust the read voltage, the command including the read offset voltage value;

transmitting the command to the memory device prior to performance of the read operation on any of the one or more vulnerable wordlines; and causing the memory device to restore the read voltage to an unadjusted read voltage after performance of the read operation on any of the one or more vulnerable wordlines.

15. The computer-implemented method as in claim 14, wherein the command is a trim command to adjust the read voltage based on a trim profile stored in the memory device.

16. A system comprising:

a memory device comprising block-addressable non-volatile memory; and a processor communicatively coupled to the memory device, the processor to execute logic to:

identify one or more vulnerable wordlines in the at least one or more memory devices likely to result in an unsuccessful read operation, wherein the one or more vulnerable wordlines are located in a partially-programmed block of the block-addressable non-volatile memory, including at least one wordline most recently programmed in the partially-programmed block characterized by a lack of floating-gate to floating-gate coupling as a result of having been programmed in the partially-programmed block, select a read offset voltage value for a read operation in the memory device, cause the memory device to proactively adjust a read voltage with the read offset voltage value prior to performance of the read operation on any of the one or more vulnerable wordlines, and cause the memory device to perform the read operation on any of the one or more vulnerable wordlines with an adjusted read voltage; and wherein, to proactively adjust a read voltage with the read offset voltage value, the processor to execute logic to:

generate a command to a memory device to adjust the read voltage, the command including the read offset voltage value, including a trim command to adjust the read voltage based on a trim profile stored in the memory device, transmit the command to the memory device prior to performance of the read operation on any of the one or more vulnerable wordlines, and cause the memory device to restore the read voltage to an unadjusted read voltage after performance of the read operation on any of the one or more vulnerable wordlines.

17. The system as in claim 16, wherein to identify the one or more vulnerable wordlines likely to result in an unsuccessful read operation, the processor to execute logic to:
track wordline offsets associated with past unsuccessful read operations on wordlines programmed in the partially-programmed block;
determine a wordline-specific pattern of tracked wordline offsets associated with past unsuccessful read operations; and
identify wordlines matching the wordline-specific pattern of tracked wordline offsets as vulnerable wordlines in advance of a read operation in the memory device.

18. The system as in claim 17, wherein any one or more of:
the unsuccessful read operation includes any one or more of an unsuccessful read of data from the memory device and an unsuccessful error recovery of data from the memory device;
the read offset voltage value is predetermined based on a characteristic of the memory device, including a performance characteristic associated with an error rate of the memory device;
the read offset voltage value is selected from a set of available read offset voltage values; and
the memory device is a three-dimensional NAND memory device having a memory array of memory cells, a wordline corresponding to a row of memory cells and the read operation is a NAND read operation performed on the wordline corresponding to the row of memory cells.

19. A non-transitory machine-readable tangible storage medium, comprising a plurality of instructions executable by a system to cause the system to:
identify one or more vulnerable wordlines in a memory device likely to result in an unsuccessful read operation, the one or more vulnerable wordlines located in a partially-programmed block of non-volatile memory in the memory device, including at least one wordline most recently programmed in the partially-programmed block characterized by a lack of floating-gate to floating-gate coupling as a result of having been programmed in a partially-programmed block;

select a read offset voltage value for a read operation in the memory device;

cause the memory device to proactively adjust a read voltage with the read offset voltage value prior to performance of the read operation on any of the one or more vulnerable wordlines;

cause the memory device to perform the read operation on any of the one or more vulnerable wordlines with an adjusted read voltage; and wherein to identify the one or more vulnerable wordlines likely to result in an unsuccessful read operation, the plurality of instructions cause the system to:
track wordline offsets associated with past unsuccessful read operations on wordlines programmed in a partially-programmed block,
determine a wordline-specific pattern of tracked wordline offsets associated with past unsuccessful read operations, and
identify wordlines matching the wordline-specific pattern of tracked wordline offsets as vulnerable wordlines in advance of a read operation in the memory device.

20. The non-transitory machine-readable tangible storage medium as in claim 19, wherein to cause the memory device to proactively adjust the read voltage with the read offset voltage value, the plurality of instructions cause the system to:
generate a command to the memory device to adjust the read voltage, the command including the read offset voltage value, the command including a trim command to adjust the read voltage based on a trim profile stored in the memory device;
transmit the command to the memory device prior to performance of the read operation on any of the one or more vulnerable wordlines; and
cause the memory device to restore the read voltage to an unadjusted read voltage after performance of the read operation on any of the one or more vulnerable wordlines.

21. The non-transitory machine-readable tangible storage medium as in claim 19, wherein any one or more of:
the unsuccessful read operation includes any one or more of an unsuccessful read of data from the memory device and an unsuccessful error recovery of data from the memory device;
the read offset voltage value is predetermined based on a characteristic of the memory device, including a performance characteristic associated with an error rate of the memory device;
the read offset voltage value is selected from a set of available read offset voltage values; and
the memory device is a three-dimensional NAND memory device having a memory array of memory cells, a wordline corresponding to a row of memory cells and the read operation is a NAND read operation performed on the wordline corresponding to the row of memory cells.

* * * * *